(12) United States Patent
Nosrati et al.

(10) Patent No.: US 10,483,147 B2
(45) Date of Patent: Nov. 19, 2019

(54) DUAL-PURPOSE VIAS FOR USE IN CERAMIC PEDESTALS

(71) Applicant: Watlow Electric Manufacturing Company, St. Louis, MO (US)

(72) Inventors: Mohammad Nosrati, Redwood City, CA (US); Kevin Ptasienski, O'Fallon, MO (US)

(73) Assignee: Wallow Electric Manufacturing Company, St. Louis, MO (US)

( * ) Notice: Subject to any disclaimer, the term of this patent is extended or adjusted under 35 U.S.C. 154(b) by 0 days.

(21) Appl. No.: 16/196,571

(22) Filed: Nov. 20, 2018

(65) Prior Publication Data

US 2019/0157127 A1 May 23, 2019

Related U.S. Application Data

(60) Provisional application No. 62/589,024, filed on Nov. 21, 2017.

(51) Int. Cl.
*H01L 21/683* (2006.01)
*H05K 1/11* (2006.01)
(Continued)

(52) U.S. Cl.
CPC .... *H01L 21/6833* (2013.01); *H01L 21/67103* (2013.01); *H01L 21/67109* (2013.01);
(Continued)

(58) Field of Classification Search
CPC ........... H01L 21/6833; H01L 21/67103; H01L 21/68785; H01L 21/6875; H01L 21/6831; H05K 1/0212; H05K 1/115; H01Q 1/38
(Continued)

(56) References Cited

U.S. PATENT DOCUMENTS

| 5,583,737 A | 12/1996 | Collins et al. |
| 5,715,132 A | 2/1998 | Steger et al. |

(Continued)

FOREIGN PATENT DOCUMENTS

| JP | H0870036 | 3/1996 |
| JP | H08107140 | 4/1996 |

(Continued)

OTHER PUBLICATIONS

International Search Report for International application PCT/US2018/062018, dated Feb. 14, 2019.

*Primary Examiner* — Dharti H Patel
(74) *Attorney, Agent, or Firm* — Burris Law, PLLC

(57) ABSTRACT

A ceramic pedestal assembly and a method of forming a ceramic pedestal assembly is provided. The ceramic pedestal assembly includes a ceramic substrate defining an upper surface and a lower surface, at least one via extending through the ceramic substrate, an upper conductive foil layer extending across the upper surface of the ceramic substrate and a lower conductive foil layer extending across the lower surface of the ceramic substrate. Each via includes an upper via defining a cavity and a lower via defining a corresponding tapered insert. In one form, the upper via, the lower via, and the conductive foil layers define a material having a melting temperature greater than 2,000° C. and a CTE less than or equal to the ceramic substrate.

16 Claims, 10 Drawing Sheets

(51) Int. Cl.
  *H05K 1/03* (2006.01)
  *H05K 1/09* (2006.01)
  *H05K 1/02* (2006.01)
  *H05K 3/40* (2006.01)
  *H01L 21/67* (2006.01)
  *H01L 21/687* (2006.01)
  *H01Q 1/38* (2006.01)

(52) U.S. Cl.
  CPC ...... *H01L 21/6831* (2013.01); *H01L 21/6875* (2013.01); *H01L 21/68785* (2013.01); *H05K 1/0212* (2013.01); *H05K 1/0224* (2013.01); *H05K 1/0306* (2013.01); *H05K 1/09* (2013.01); *H05K 1/115* (2013.01); *H05K 3/4038* (2013.01); *H01Q 1/38* (2013.01); *H05K 2201/09827* (2013.01)

(58) Field of Classification Search
  USPC .......................................................... 361/234
  See application file for complete search history.

(56) References Cited

U.S. PATENT DOCUMENTS

| | | | |
|---|---|---|---|
| 5,753,132 | A | 5/1998 | Shamouilian et al. |
| 6,104,596 | A | 8/2000 | Hausmann |
| 6,215,641 | B1 | 4/2001 | Busse et al. |
| 6,310,755 | B1 * | 10/2001 | Kholodenko ......... C04B 35/185 361/115 |
| 6,780,787 | B2 | 8/2004 | O'Donnell |
| 8,075,729 | B2 | 12/2011 | Holland et al. |
| 9,583,371 | B2 | 2/2017 | Shim et al. |
| 9,660,557 | B2 | 5/2017 | Shiraiwa et al. |
| 2006/0021705 | A1 | 2/2006 | Imai et al. |
| 2007/0046306 | A1 | 3/2007 | Awazu et al. |
| 2008/0016684 | A1 | 1/2008 | Olechnowicz et al. |

FOREIGN PATENT DOCUMENTS

| | | |
|---|---|---|
| JP | H10116888 | 5/1998 |
| WO | 2016060960 | 4/2016 |

* cited by examiner

Green State

Sintered State

DUAL-PURPOSE VIAS FOR USE IN CERAMIC PEDESTALS

CROSS-REFERENCE TO RELATED APPLICATIONS

The present application claims priority to and the benefit of U.S. Provisional Application No. 62/589,024, titled "DUAL-PURPOSE VIAS FOR USE IN CERAMIC PEDESTALS" filed Nov. 21, 2017, the contents of which are incorporated herein by reference in their entirety.

FIELD

The present disclosure relates generally to semiconductor processing apparatuses, and more particularly to substrate support pedestals for supporting and heating a substrate, such as a wafer, thereon.

BACKGROUND

The statements in this section merely provide background information related to the present disclosure and may not constitute prior art.

A wafer support assembly such as a pedestal for semiconductor processing is disposed in a semiconductor processing chamber and typically includes a wafer support portion and a shaft secured to a central region of the wafer support portion. The wafer support portion may include a resistive layer having a resistive heating element for generating heat and electric terminations for connecting the resistive heating elements to an external power source. The electric terminations are disposed adjacent to the central region of the wafer support portion and extend in the shaft. Typically, when integrating more than one resistive layer, a routing layer and vias or interconnects are used to interconnect and terminate the heater circuits in the central region of the wafer support portion.

Top and bottom layers of the wafer support portion are bonded together for example by diffusion bonding or assisted hot press sintering. This high-pressure, low-strain process forms a powder or compacted powder at a high enough temperature to induce sintering in order to form a high-density component/compact. Typically, the compacted powder is put into a mold and high temperatures and pressure are applied for densification and sintering. The mold is made of a material that can withstand the high temperatures and pressures, such as for example, graphite.

Challenges associated with integrated vias or interconnects during hot press sintering include induced stresses due to shrinkage of ceramic, uncontrollable and unpredicted displacements, high plastic deformation, and failure and fracturing of the electrically conductive vias. Another issue is interaction of the vias and ceramic material during hot press sintering process with carbon that is emitted from graphite molds. These challenges, among other challenges in the use of ceramic pedestals in semiconductor processing are addressed by the present disclosure.

SUMMARY

In one form, the present disclosure provides a ceramic pedestal assembly that includes a substrate having a first functional layer and a second functional layer, wherein the first and second functional layers are disposed at opposite sides of the substrate. The ceramic pedestal assembly further includes at least one via extending through the substrate, each via includes an upper via defining a cavity and a lower via defining a corresponding insert. The first functional layer, the second functional layer, and the vias define a material having a melting temperature greater than 2,000° C. and a CTE lower than the substrate.

In one variation, the substrate is made of an aluminum nitride material, and the at least one via, the first functional layer, and the second functional layer are made of a molybdenum material.

In other variations, the lower via is received by the cavity of the upper via such that an interference fit is formed between the upper and lower via when the ceramic substrate is heated, a top portion of the upper via and a bottom portion of the lower via are tapered, and/or the cavity of the upper via and the corresponding insert of the lower cavity have a cross-sectional shape selected from the group consisting of polygonal, planar, circular, oval, triangular, and elliptical. The first functional layer may be a resistive heater layer having at least one resistive heating element and the second functional layer is a routing layer, wherein each resistive heating element defines at least one resistive heating zone.

In a further variation, the ceramic pedestal assembly further includes at least one sacrificial layer across at least one of the first functional layer and the second functional layer. The sacrificial layer(s) may be selected from the group consisting of Tungsten, Tungsten Carbide, and Boron Nitride.

In still another variation, the ceramic pedestal assembly further includes a radio frequency (RF) grid layer.

In another form, the present disclosure provides a ceramic pedestal assembly that includes a ceramic substrate defining an upper surface and a lower surface and at least one via extending through the ceramic substrate. The at least one via comprises an upper via defining a tapered cavity and a lower via defining a corresponding tapered insert. The ceramic pedestal assembly further comprises an upper conductive foil layer extending across the upper surface of the ceramic substrate and a lower conductive foil layer extending across the lower surface of the ceramic substrate. The upper via, the lower via, and the conductive foil layers define a material having a melting temperature greater than 2,000° C. and a CTE less than or equal to the ceramic substrate. A top portion of the via and a bottom portion of the lower via is tapered. The lower via is received by the cavity of the upper via such that an interference fit is formed between the upper and lower via when the ceramic substrate is heated.

In other variations, the ceramic pedestal assembly may further comprise at least one sacrificial layer across at least one of the upper and lower conductive foil layers. The sacrificial layer may be selected from the group consisting of Tungsten, Tungsten Carbide, and Boron Nitride. A top portion of the upper via and a bottom portion of the lower via may be tapered.

The present disclosure further provides a method of forming a ceramic pedestal assembly. The method comprises the steps of forming a ceramic substrate in a green state with at least one aperture, placing an upper via defining a tapered cavity through an upper surface of the ceramic substrate, placing a lower via defining a corresponding tapered insert through a lower surface of the ceramic substrate, placing an upper conductive foil layer across the upper surface of the ceramic substrate, placing a lower conductive foil layer extending across the lower surface of the ceramic substrate, and hot pressing the assembly in a uniaxial direction. In this form, the upper via, the lower via, and the conductive foil layers define a material having a melting temperature greater than 2,000° C. and a CTE less than or equal to the ceramic substrate. The assembly may be placed into a graphite mold.

In one variation, the ceramic substrate is made of an aluminum nitride material, and the upper via, the lower via, and the upper and lower conductive foil layers are made of a molybdenum material.

In another variation, the method further includes sintering the pressurized assembly at a temperature ranging from about 1700 C to about 2,000° C.

In another variation, the method further includes placing at least one sacrificial layer across at least one of the upper conductive foil layer and the lower conductive foil layer and then removing the sacrificial layer. The sacrificial layer is selected from the group consisting of Tungsten, Tungsten Carbide, and Boron Nitride.

In other variations, the method includes forming at least one of a heater layer in the upper conductive foil layer, forming a routing layer in the lower conductive foil layer, and forming a RF grid layer.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The present disclosure will become more fully understood from the detailed description and the accompanying drawings, wherein.

Corresponding reference numerals indicate corresponding parts throughout the several views of the drawings.

DETAILED DESCRIPTION

The following description is merely exemplary in nature and is not intended to limit the present disclosure, application, or uses.

Figure 1:
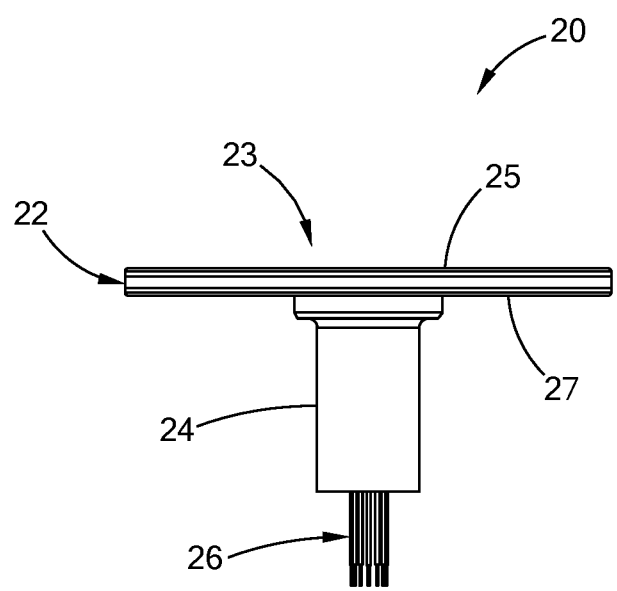
FIG. 1 is a side view of a ceramic pedestal assembly constructed in accordance with the teachings of the present disclosure.

Referring to FIG. 1, a support pedestal 20 constructed in accordance with the teachings of the present disclosure may be used in a semiconductor processing chamber for supporting and heating a heating target, such as a wafer, thereon. The support pedestal 20 includes a ceramic pedestal assembly 22 and a tubular shaft 24 attached to a central region 23 of the pedestal assembly 22. The pedestal assembly 22 includes a top surface 25 for supporting a substrate, such as a wafer (not shown) thereon, and a bottom surface 27 to which the tubular shaft 24 is attached. The support pedestal 20 further includes a plurality of electric cables 26 received in the tubular shaft 24 for connecting at least one electric element/layer (not shown) embedded in the pedestal assembly 22 and connected to an external power source. The electric layer may be a resistive heating layer, a temperature sensor, an electrode for an electrostatic chuck (ESC), or a Radio Frequency (RF) antenna, etc., depending on the application. While not shown in the drawings, the pedestal assembly 22 may optionally define a gas conduit for receiving a purge gas and a vacuum conduit to provide vacuum clamping for the wafer. Additional information regarding the support pedestal has been disclosed in Applicant's concurrently filed co-pending application titled "Multi-zone Ceramic Pedestal" which is commonly owned with the present application and the contents of which are incorporated herein by reference in its entirety.

Figure 2:
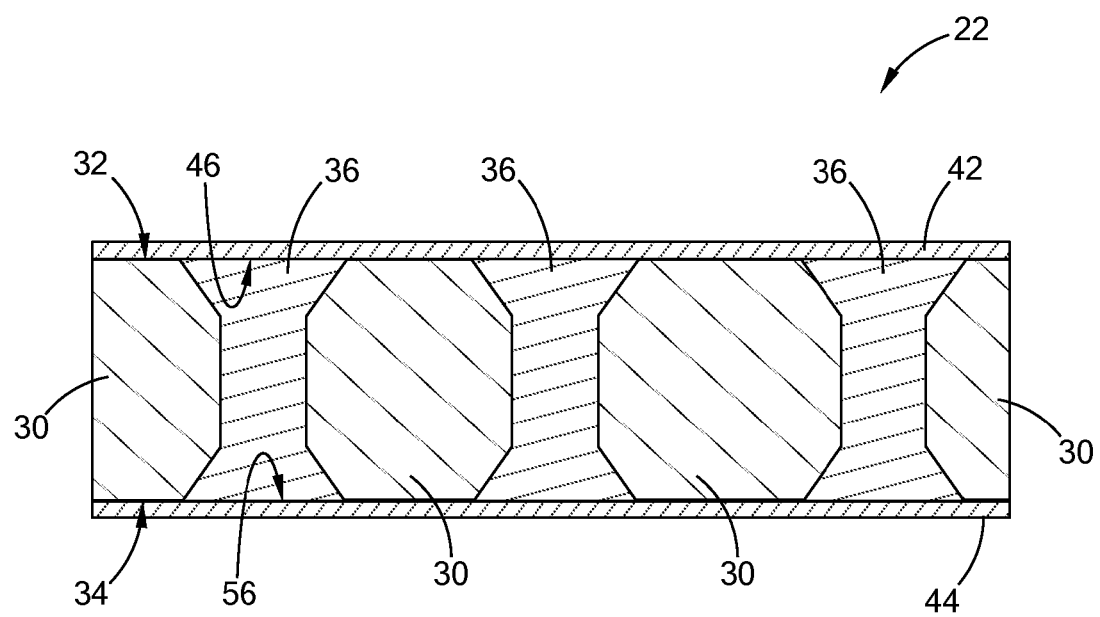
FIG. 2 is a partial side cross-sectional view of a ceramic pedestal assembly constructed in accordance with the present disclosure.

Referring to FIG. 2, a partial side cross-sectional view of the ceramic pedestal assembly 22 is illustrated according to the teachings of the present disclosure. In this form, the ceramic pedestal assembly 22 comprises a ceramic substrate 30 defining an upper surface 32 and a lower surface 34. The assembly 22 further comprises at least one via 36 extending through the ceramic substrate 30, an upper conductive foil layer 42, and a lower conductive foil layer 44. In this form, the at least one via 36, the upper conductive foil layer 42, and the lower conductive foil layer 44 are made of a material having a melting temperature greater than 2,000° C. and a coefficient of thermal expansion (CTE) less than or equal to the ceramic substrate 30, which is described in greater detail below.

The at least one via 36 extends through the ceramic substrate 30 such that a top surface 46 of the via 36 is in contact with the upper conductive foil layer 42 and a bottom surface 56 of the via 36 is in contact with the lower conductive foil layer 44. The vias 36 are also a conductive material, and the vias 36 provide electrical continuity between the upper conductive foil layer 42 and a lower conductive foil layer 44.

In one form, the conductive foil layer 42 is a resistive layer for generating heat, and the lower conductive foil layer 44 is a routing layer. More particularly, the resistive layer includes a plurality of resistive heating elements that are independently controllable and that define one or more heating zones. The routing layer is electrically connected to one or more of the cables 26 and is configured to control the power supplied to the heating zones of the resistive layer. The vias 36 extend through the substrate 30 and electrically connect the resistive layer and the routing layer that are disposed on opposite sides/surfaces of the substrate 30.

Thus, the routing layer supplies power to one or more zones of the resistive layer by way of the vias 36.

It should be understood that the foil layers 42, 44 may be provided in another product form other than foil, such as by way of example in a "layered" form, wherein "layered" should be construed as a product form that is produced by processes such as thin film, thick film, thermal spraying, and sol-gel wherein the layer is formed through application or accumulation of a material to a substrate. Therefore, the foil layers 42, 44 and their placement relative to the ceramic substrate 30 should not be construed as limiting the scope of the present disclosure. Accordingly, these layers may also be referred to as "functional layers" in a broader sense such that the present disclosure is not limited to the conductive foil or the specific functions of a heater and a routing layer as illustrated and described herein.

Furthermore, the ceramic pedestal assembly 22 may include additional layers (e.g., additional functional layers such as bonding layer, dielectric layer, sensing layer, and protective layer, among others) while remaining within the scope of the present disclosure. In one exemplary form, the ceramic pedestal assembly 22 further comprises an integrated radio frequency (RF) grid layer, which is electrically connected to the ground terminal to compensate RF plasma or magnetic field imposed by processing chamber. Alternatively, at least one of the upper conductive foil layer 42 and the lower conductive foil layer 44 is a RF grid layer. Generally, the RF grid layer is used as antenna to direct RF plasma or magnetic field imposed by processing chamber through ground terminal and shield and protect heaters circuits and sensors devices.

Forming the ceramic pedestal assembly 22 includes taking powder, already formed into a desired shape, and converting the powder material into a dense solid by heating the assembly, i.e. sintering. A green state refers to the shaped powder or shaped green body before the assembly is heated.

Figure 3:
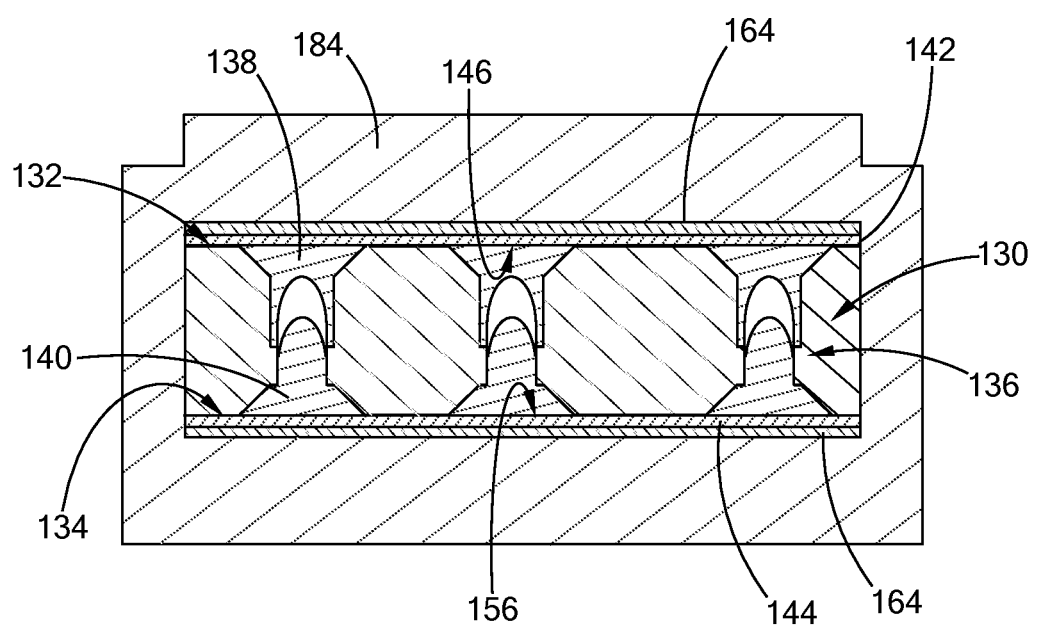
FIG. 3 illustrates a green state of the ceramic pedestal assembly in accordance with the teachings of the present disclosure.
Figure 4:
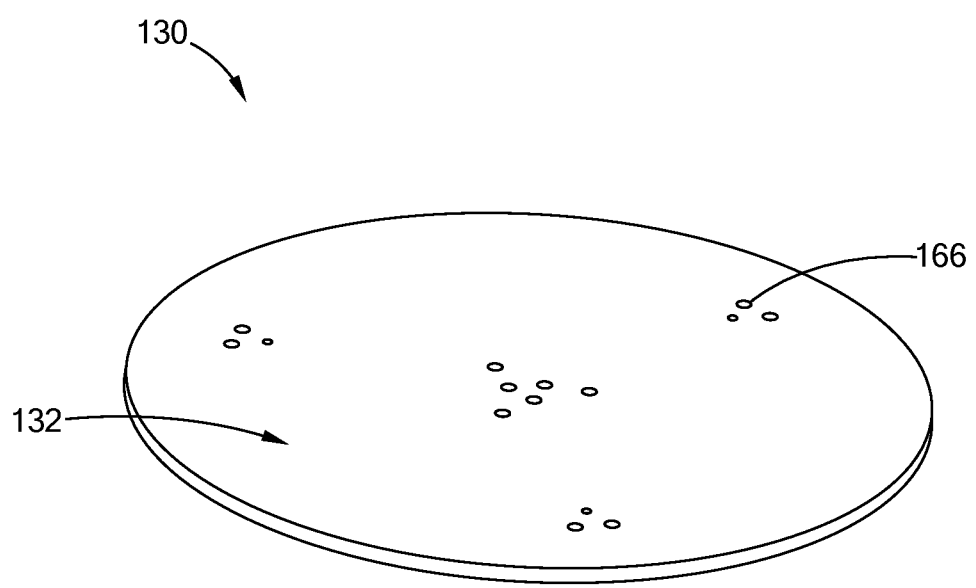
FIG. 4 is a top perspective view of a ceramic substrate according to one form of the present disclosure.
Figure 5A:
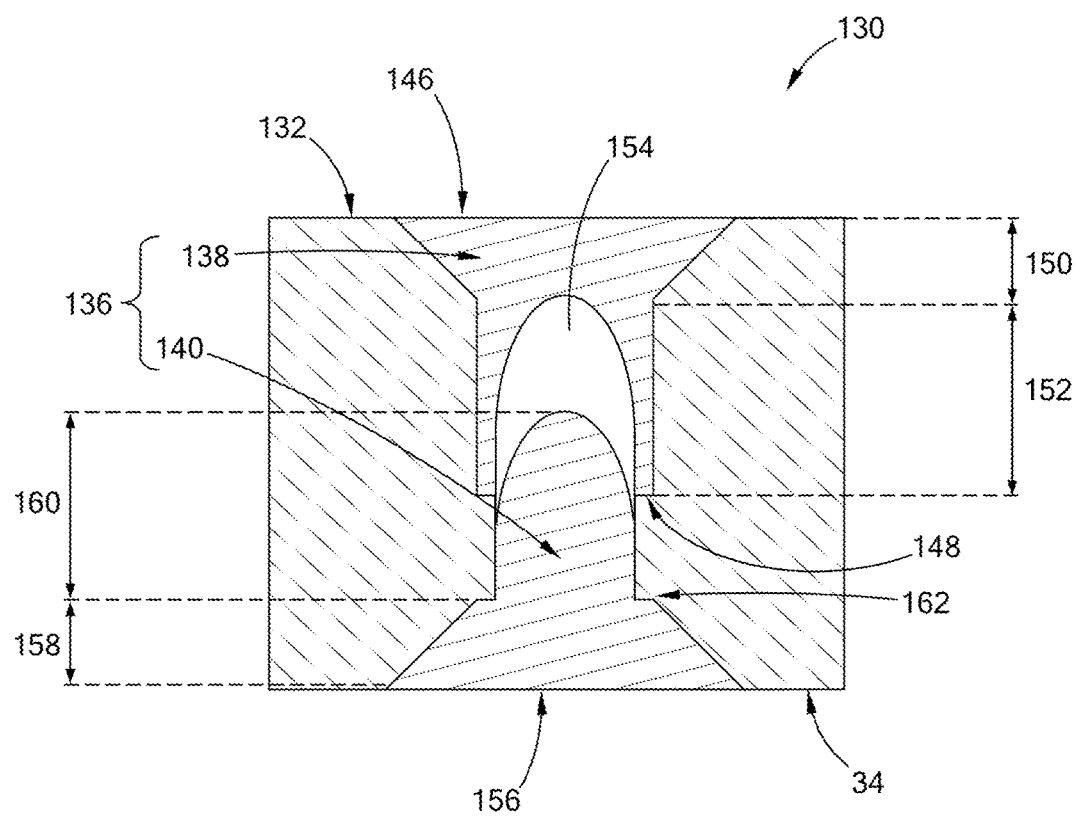
FIG. 5A is a cross-sectional view of a via extending through a ceramic substrate that is in a green state in accordance with the present disclosure.

FIGS. 3, 4, and 5A illustrate forming the ceramic pedestal assembly 22 based on the teachings of the present disclosure. To form the ceramic pedestal assembly 22, a ceramic substrate 130 that is in the green state, is provided. The ceramic substrate 130 has an upper surface 132 and a lower surface 134 and defines at least one aperture 166 (FIG. 4) that extends through the ceramic substrate 130 for receiving a via 136 (FIG. 3). The number of apertures 166 corresponds to the number of vias 136. The ceramic substrate 130 in the green state may be formed by, for example, cold isostatic pressing (CIP) technology, thereby providing the desired strength to handle, machine, and sinter the ceramic pedestal assembly.

With continuing reference to FIGS. 3 and 5A, each via 136 comprises an upper via 138 defining a tapered cavity 154 and a lower via 140 having a corresponding tapered insert 160. The upper via 138 includes a tapered top portion 150 that has an upper surface 146 and includes a neck 152 that extends from the tapered top portion 150. The neck 152 defines the tapered cavity 154 and further has a bottom surface 148. The corresponding tapered insert 160 of the lower via 140 extends from a tapered bottom portion 158. The tapered bottom portion 158 has a lower surface 156 and a top surface 162 that extends radially from a distal end of the insert 160. The lower via 140 is received by the cavity 154 of the upper via 138, and an interference/tight fit is formed between the upper via 138 and the lower via 140 when the ceramic substrate 31 is sintered, which is described in greater detail below.

Figure 5B:
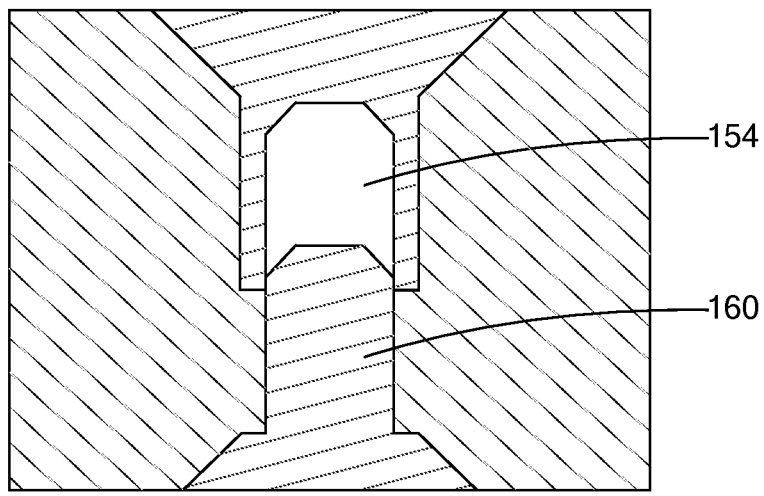
FIG. 5B is a cross-sectional view of vias having a chamfered insert and chamfered cavity according to an alternate form of the present disclosure.
Figure 5C:
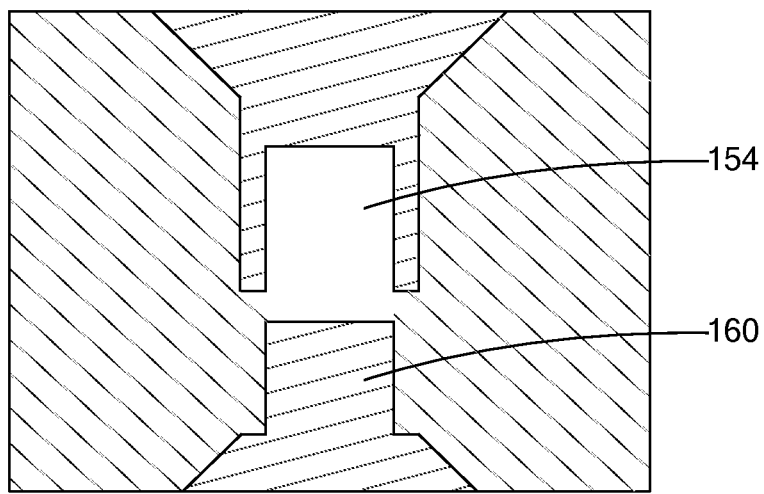
FIG. 5C is a cross-sectional view of vias having generally rectangular cross-sections.

In one form, the cavity 154 of the upper via 138 and the corresponding insert 160 of the lower via 140 have a circular cross-sectional shape. However, it should be understood that the cross-section may be another suitable shape and should not be limited to a circular cross-section. Alternate forms of the cavity 154 and the corresponding insert 160 are shown in FIGS. 5B and 5C having a cross-sectional shape that is chamfered and rectangular, respectively. Furthermore, the cavity 154 and the corresponding insert 160 may have a cross-sectional shape selected from the following group: polygonal, planar, oval, triangular, elliptical, and any other shape that allows an interference/tight fit to form between the upper and lower vias when the ceramic substrate 130 is sintered. Design of upper and lower vias can be engineered to compensate ceramic shrinkage during the hot press sintering. For example, the graphite mold can be designed in such a way to constrain the displacements and shrinkage of the ceramic and vias in X and Y directions with controlled displacement occurring in Z direction of the hot press axial load.

The upper via 138 is placed in the aperture 166 from the upper surface side 132 of the ceramic substrate 130 such that the upper surface 146 of the upper via 138 is substantially flush with the upper surface 132 of the ceramic substrate 130. The corresponding lower via 140 is placed in the aperture 166 from the lower surface side 134 of the ceramic substrate 130 such that the lower surface 156 of the lower via 140 is substantially flush with the lower surface 134 of the ceramic substrate 130. The insert 160 of the lower via 140 is received by the cavity 154 of the upper via 138 (FIGS. 3 and 5). In one form, the insert 160 has a tapered shape end that aligns with and is received by the cavity 154 to improve alignment/fit and to compensate for manufacturing tolerances and thermal variation between the upper via 138 and the lower via 140 and the ceramic substrate 130.

After the upper via 138 and the lower via 140 are placed through the ceramic substrate 130, an upper conductive foil layer 142 is placed across/along the upper surface 132 of the ceramic substrate 130 and a lower conductive foil layer 144 is placed across/along the lower surface 134 of the ceramic substrate 130 (FIG. 3). The upper foil layer 142 is in contact with the upper surface 132 of the ceramic substrate 130 and the upper surface 146 of the upper via 138. The lower foil 144 is in contact with the lower surface 134 of the ceramic substrate 130 and the lower surface 156 of the lower via 140. Before sintering, the ceramic substrate 130 with the vias 136, and the layers 142 and 144 may be generally referred to as a green state ceramic pedestal assembly.

In another form, the green state ceramic pedestal assembly further comprises at least one sacrificial layer 164 across at least one of the upper conductive foil layer 142 and the lower conductive foil layer 144. The sacrificial layer 164 reduces cross contamination during sintering and is removed after sintering. For instance, the sacrificial layer absorbs emitted carbon from graphite mold and reduces the ceramic reaction and interaction with excess emitted carbon. It also prevents discoloration in the bulk and surface of the ceramic. The sacrificial layer 164 is selected from the group consisting of Tungsten, Tungsten Carbide, and Boron Nitride. However, it should be understood that other materials may also be employed while still remaining within the scope of the present disclosure.

The components of the ceramic pedestal assembly 22 may be any of a variety of materials, and in one form, the upper via 138, the lower via 140, the upper conductive foil layer 142, and the lower conductive foil layer 144 define a material having a melting temperature greater than 2,000° C. and a coefficient of thermal expansion (CTE) comparable or lower than, or in other words, less than or approximately equal to, the ceramic substrate. For example, the ceramic substrate 130 may be an aluminum nitride (AlN) material and the upper via 138, the lower via 140, and the upper conductive foil layers 142, and the lower conductive foil layer 144 are made of a molybdenum (Mo) material. Molybdenum is capable of withstanding temperatures greater than 2,000° C., and its CTE comparable or lower than AlN. It should be understood that other material combinations may also be employed for the vias and ceramic substrate, provided the materials can withstand temperatures greater than 2,000° C., and the coefficient of thermal expansion (CTE) of the vias is lower than the ceramic substrate. Therefore, the use of Mo and AlN should not be construed as limiting the scope of the present disclosure.

Figure 6:
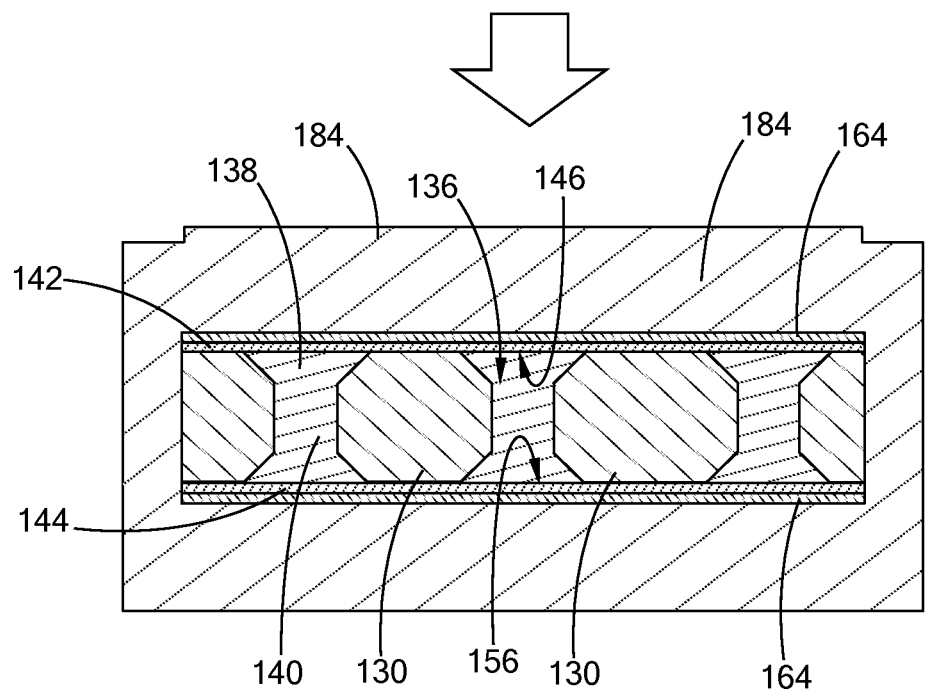
FIG. 6 illustrates a sintered state of the ceramic pedestal assembly in accordance with the teachings of the present disclosure.
Figure 7:
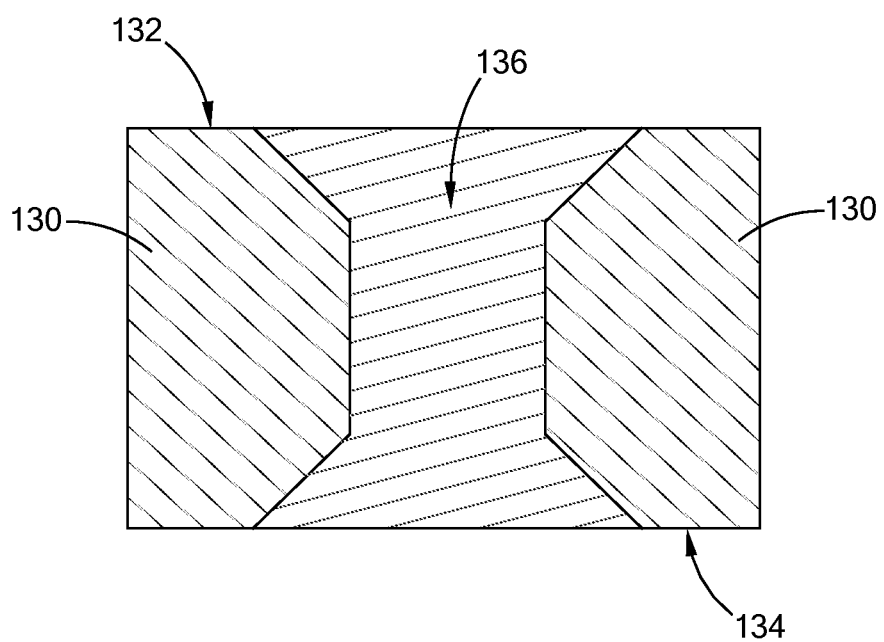
FIG. 7 is an enlarged view of a via of FIG. 6 extending through a ceramic substrate and in a sintered state in accordance with the teachings of the present disclosure.

The green state ceramic pedestal assembly is placed in a hot press mold 184 made of a material that can withstand hot press sintering, such as graphite. Referring to FIGS. 6 and 7, the green state ceramic pedestal assembly is hot pressed in a uniaxial direction, and sintered at a temperature ranging from, for example, about 1700 C to about 2,000° C. During hot press sintering, in which pressure is applied under high temperatures, the upper via 138, the lower via 140, the upper conductive foil layer 142, and the lower conductive foil layer 144, which are made of material having a high melting point (e.g., Mo material of approximately 2620° C.), retain their form and are not warped by the sintering process.

Furthermore, uniaxial pressure compresses the upper via 138 and the lower via 140 together such that the neck 152 of the upper via 138 engages with the insert 160 of the lower via 140, and the insert 160 further penetrates the cavity 154. In one form, the top surface 162 of the tapered bottom portion 158 acts as a stop for the neck 152 such that the bottom surface 148 of the neck 152 abuts with the top surface 162 of the tapered bottom portion 158 of the lower via 140. Alternatively, the bottom surface 148 of the neck 152 may be positioned above the top surface 162 of the tapered bottom portion 158 such that a slight gap is defined there between. The uniaxial compression further bonds the upper conductive foil layer 142 and the lower conductive foil layer 144 to the upper surface 132 and the lower surface 134 of the ceramic substrate 130, respectively.

Because AlN exhibits a higher coefficient of thermal expansion (CTE) than that of Mo, the AlN substrate 130 expands during the sintering process, whereas the via 136 made of Mo material may retain its original shape. The expanding substrate 130 applies additional compressive forces in all directions onto the via 136 such that during shrinkage, the substrate 130 substantially encapsulates the via 136 and tightly secures the upper via 138 and the lower via 140 within the substrate 130.

During sintering, the vertical position and alignment of the via 136 within the substrate 130 is controlled by the tapered top portion 150 and cavity 154 of the upper via 138, and the tapered bottom portion 58 and the insert 160 of the of the lower via 140. For example, the tapered top portion 150 engages with the sides of the aperture 166 while the upper surface 146 of the upper via 138 remains substantially flush with the upper surface 132 of the ceramic substrate 130. The tapered bottom portion 158 functions in a similar manner as the tapered top portion 150. Furthermore, the insert 160 and the neck 152 having the cavity 154 are configured to engage with one another to prevent the via 136 from protruding beyond the upper and lower surfaces 132 and 134 of the ceramic substrate. After sintering, the upper via 138 and the lower via 140 form a single conductive via. See FIGS. 6 and 7.

By using Molybdenum for at least the via 136, the upper via 138 and the lower via 140 can self-adjust during compression and shrinkage since the Mo material is a high refractory metal, malleable, ductile and with a body-centered cubic crystalline structure. Furthermore, Molybdenum experiences much lower plastic deformation, residual stress, and fracturing during the sintering process.

Additionally, Molybdenum captures the carbon that is let off by the graphite mold 84. In other words, Molybdenum attracts the carbon that is released from the graphite mold 184, thereby decreasing undesired interaction and discoloration of the AlN substrate 130 that may occur during the sintering process.

After sintering, the upper conductive foil layer 142 and the lower conductive foil layer 144 can be configured in various suitable ways based on the desired configuration of the final ceramic pedestal assembly. For example, in one form, the upper conduction foil layer 142 can be formed as a resistive layer for generating heat and the lower conductive foil layer 144 can be a routing layer for connecting the resistive layer to a power source (not shown) or other elements of the support pedestal 20.

Figure 8:
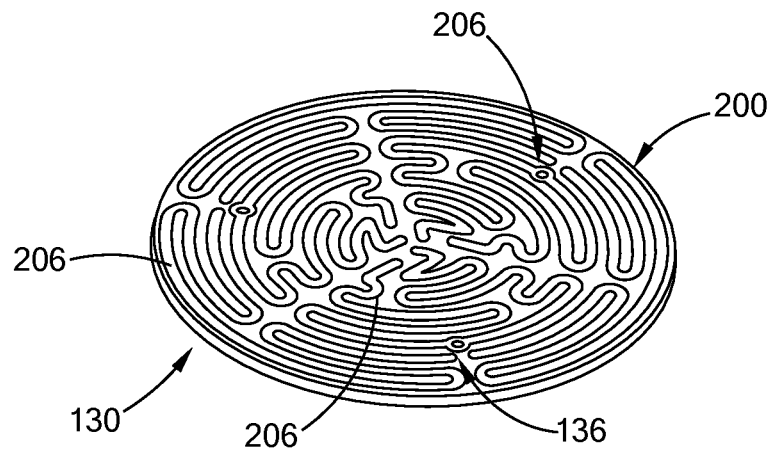
FIG. 8 is a perspective view of an upper conductive foil layer as a resistive heater layer formed on a ceramic substrate in accordance with the teachings of the present disclosure.
Figure 9:
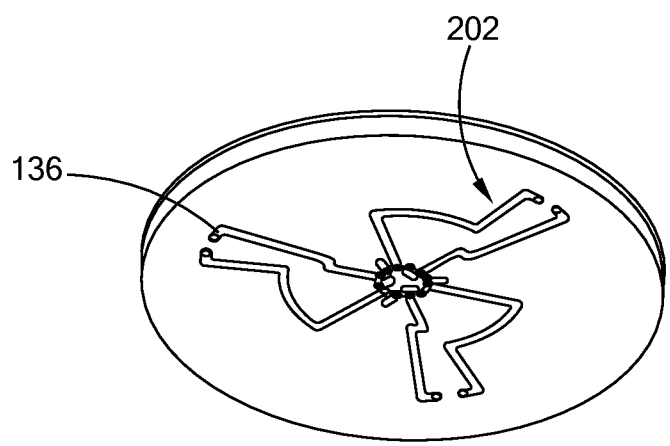
FIG. 9 is a perspective view of a lower conductive foil layer as a routing layer formed on a ceramic substrate in accordance with the teachings of the present disclosure.

Referring to FIGS. 8 and 9, an example of a resistive heater layer 200 and a routing layer 202 is provided. The upper conductive foil layer 142 etched to form the resistive layer 200 that includes one or more resistive heating element that define at least one heating zone. In FIG. 8, six resistive heating elements 206 are shown that define six heating zones, however, any number of resistive heating elements 206 can be used without departing from the scope of the present disclosure. The lower conductive foil layer 144 is etched to form the routing layer 202 for electrically coupling power to the vias 136. Thus, as described above, the vias 136 electrically couple the routing layer and the resistive heater layer. Additional information regarding resistive heating layers and routing layers has been disclosed in co-pending application titled "Multi-Zone Ceramic Pedestal" concurrently filed herewith and commonly owned with the present application, the contents of which are incorporated herein by reference in its entirety.

The conductive layers can be configured in other suitable ways and should not be limited to the restive layer and the routing layer. For example, in another form of the present disclosure, at least one of the upper conductive foil layer and the lower conductive foil layer can be configured as a RF grid layer. In yet another form, the lower conductive foil layer can be configured to include a routing layer and a second resistive heater layer.

Figure 10:
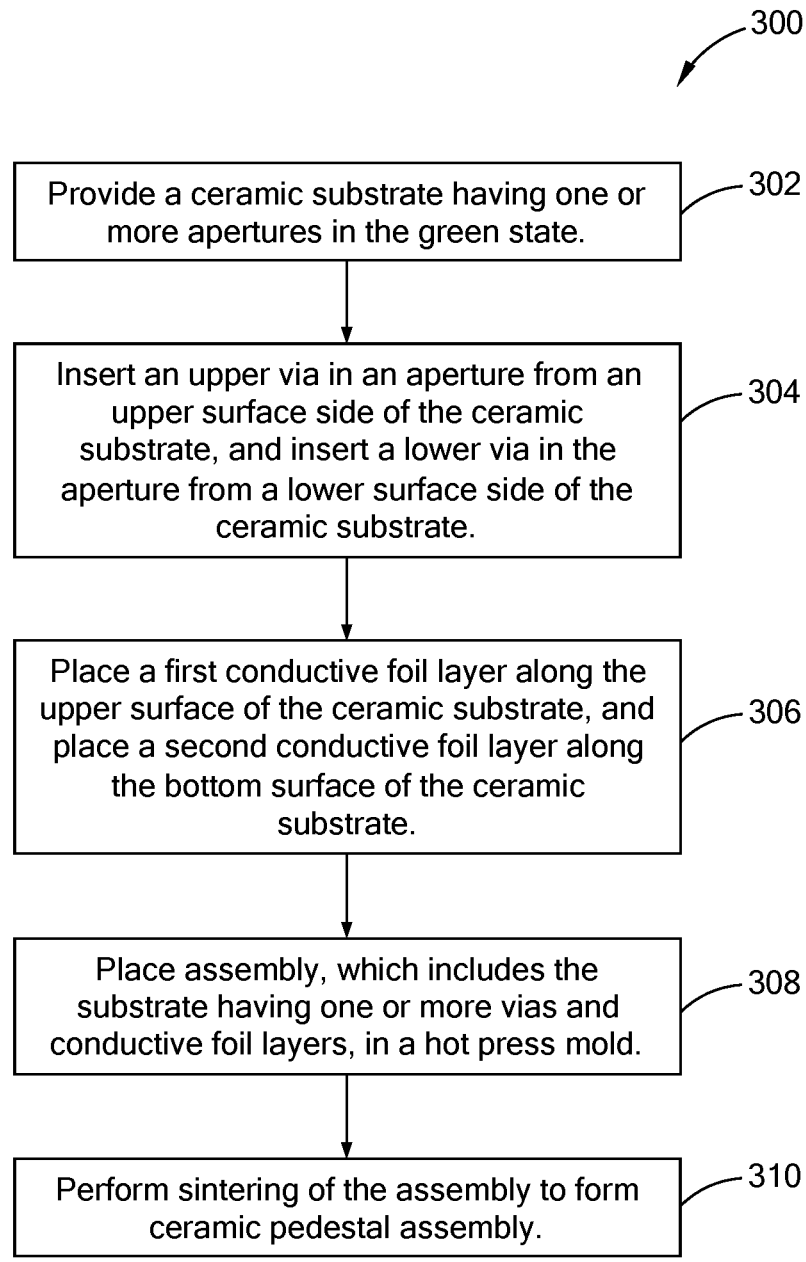
FIG. 10 is a flow chart illustrating a method of forming a ceramic pedestal assembly in accordance with the teachings of the present disclosure.

Referring to FIG. 10, a method 300 of forming a ceramic pedestal assembly, as described above, is illustrated in schematic form. At 302, a ceramic substrate in a green state is provided and can be formed by, for example, CIP technology. The ceramic substrate includes one or more apertures. At 304, a via is placed in an aperture. For example, an upper via is placed in the aperture from an upper surface side of the ceramic substrate and a lower via is placed in an aperture from a lower surface side of the ceramic substrate.

At 306, a first (upper) conductive foil layer is placed along the upper surface of the ceramic substrate, and a second (lower) conductive foil layer is placed along the lower surface of the ceramic substrate. At 308, the assembly, which includes the ceramic pedestal in the green state, the vias, and the conductive foil layers, is placed into a hot press mold, and at 310, a sintering process is performed on the assembly to form the ceramic pedestal assembly. The mold is made of a material that can withstand the sintering process, such as graphite. During sintering, the assembly is hot pressed in a uniaxial direction and sintered at a temperature ranging from about 1700° C. to about 2,000° C. The uniaxial compression causes the upper and lower vias to move toward each other to form a single conductive via, and the conductive foil layers bond to the surfaces of the ceramic substrate. As a result, the upper and lower conductive foil layers are electrically coupled by the via.

The method 300 is just one example of forming the ceramic substrate assembly of the present disclosure and may include other or alternate steps. For example, in another form, the method 300 further includes placing at least one sacrificial layer (not shown) along at least one of the conductive foil layers to reduce cross contamination during sintering. After the sintering process, the sacrificial layer is removed from the assembly.

In yet another form, the method 300 includes, after the sintering process, etching the conductive foil layers to form, for example, one or more resistive heater layers and a routing layer.

In still another form, the method 300 may include etching at least one conductive foil layer to form a RF grid layer.

The ceramic pedestal assembly 22 of the present disclosure combines the ceramic substrate 30 with the at least one via 36, the upper conductive foil layer 42, and the lower conductive foil layer 44 in the green state, and bonds the components, as described herein, using hot press sintering. Combining the via 36, which is formed of a high refractory metal, with the ceramic substrate 30 before the sintering process allows compressive forces during hot pressing to create a tightly secured bond between the upper and lower vias 38 and 40, and between the via 36 and the substrate 30. Additionally, including the conductive foil layers 42 and 44 in the green state before sintering, which are electrically coupled to each other by the via 36, creates consistent ohmic contact with minimal plastic deformity. It should be understood, however, that the conductive foil layers 42/44, or other functional layers, may be added to the ceramic substrate 30 after the sintering process while remaining within the scope of the present disclosure.

Furthermore, the two-part via of the present disclosure are integrated vias and interconnect at the green state. This can reduce hot press processing steps and be more cost effective than conventional single-piece vias. The two-part vias also move freely in the direction of the hot press axial load and compensate the effect of ceramic shrinkage. And although a two-part via is illustrated and described, any number of parts/components may be employed, including more than two, to form an integrated via while remaining within the scope of the present disclosure.

It should be noted that the disclosure is not limited to the various forms described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. A ceramic pedestal assembly comprising:
    a substrate having a first functional layer and a second functional layer, the first and second functional layers disposed at opposite sides of the substrate; and
    at least one via extending through the substrate comprising:
        an upper via defining a cavity; and
        a lower via defining a corresponding insert,
    wherein the first functional layer, the second functional layer, and the at least one via define a material having a melting temperature greater than 2,000° C. and a CTE (coefficient of thermal expansion) lower than the substrate.

2. The ceramic pedestal assembly according to claim 1, wherein the substrate is made of an aluminum nitride material, and the at least one via, the first functional layer, and the second functional layer are made of a molybdenum material.

3. The ceramic pedestal assembly according to claim 1, wherein the lower via is received by the cavity of the upper via such that an interference fit is formed between the upper and lower via when the ceramic substrate is heated.

4. The ceramic pedestal assembly according to claim 1, wherein a top portion of the upper via and a bottom portion of the lower via is tapered.

5. The ceramic pedestal assembly according to claim 1, wherein the first functional layer is a resistive heater layer having at least one resistive heating element and the second functional layer is a routing layer, wherein each resistive heating element defines at least one resistive heating zone.

6. The ceramic pedestal assembly according to claim 1, wherein the cavity of the upper via and the corresponding insert of the lower cavity have a cross-sectional shape selected from the group consisting of polygonal, planar, circular, oval, triangular, and elliptical.

7. The ceramic pedestal assembly according to claim 1 further comprising at least one sacrificial layer across at least one of the first functional layer and the second functional layer.

8. The ceramic pedestal assembly according to claim 7, wherein the sacrificial layer is selected from the group consisting of Tungsten, Tungsten Carbide, and Boron Nitride.

9. The ceramic pedestal assembly according to claim 1 further comprises an RF grid layer.

10. The ceramic pedestal assembly according to claim 1, wherein the first functional layer is an upper conductive foil layer extending across an upper surface of the substrate and the second functional layer is a lower conductive foil layer extending across a lower surface of the substrate.

11. The ceramic pedestal assembly according to claim 1, wherein the cavity of the upper via is tapered and the lower via defines a corresponding taper.

12. A method of forming a ceramic pedestal assembly comprising:
    forming a ceramic substrate in a green state with at least one aperture;
    placing an upper via defining a cavity through an upper surface of the ceramic substrate;
    placing a lower via defining a corresponding insert through a lower surface of the ceramic substrate;
    placing an upper functional layer across the upper surface of the ceramic substrate;
    placing a lower functional layer extending across the lower surface of the ceramic substrate; and
    hot pressing the assembly in a uniaxial direction,
    wherein the upper via, the lower via, and the functional layers define a material having a melting temperature greater than 2,000° C. and a CTE (coefficient of thermal expansion) less than or equal to the ceramic substrate.

13. The method of claim 12 further comprising sintering the ceramic pedestal assembly at a temperature ranging from about 1700° C. to about 2,000° C.

14. The method of claim 12 further comprising placing the assembly into a graphite mold.

15. The method of claim 12 further comprising placing at least one sacrificial layer across at least one of the upper functional layer and the lower functional layer.

16. The method of claim 12 further comprising forming a Radio Frequency (RF) grid layer on the substrate.

* * * * *

UNITED STATES PATENT AND TRADEMARK OFFICE
CERTIFICATE OF CORRECTION

PATENT NO. : 10,483,147 B2
APPLICATION NO. : 16/196571
DATED : November 19, 2019
INVENTOR(S) : Mohammad Nosrati and Kevin Ptasienski Page 1 of 1

It is certified that error appears in the above-identified patent and that said Letters Patent is hereby corrected as shown below:

On the Title Page

Item (73) Assignee, "Wallow Electric Manufacturing Company" should be --Watlow Electric Manufacturing Company--

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*